(12) United States Patent
Ito

(10) Patent No.: US 8,974,167 B2
(45) Date of Patent: Mar. 10, 2015

(54) AUTOMATIC STORAGE SYSTEM

(75) Inventor: Yasuhisa Ito, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 607 days.

(21) Appl. No.: 12/801,354

(22) Filed: Jun. 4, 2010

(65) Prior Publication Data

US 2010/0316471 A1    Dec. 16, 2010

(30) Foreign Application Priority Data

Jun. 15, 2009   (JP) ................................. 2009-142619

(51) Int. Cl.
*H01L 21/677*    (2006.01)
(52) U.S. Cl.
CPC ......... *H01L 21/67769* (2013.01); *Y10S 414/14* (2013.01)
USPC .......................................... 414/217; 414/940
(58) Field of Classification Search
CPC ................... H01L 21/67724; H01L 21/67775
USPC ............................ 414/217, 940, 331.06, 331.1
See application file for complete search history.

(56) References Cited

U.S. PATENT DOCUMENTS

| 4,923,352 | A | * | 5/1990 | Tamura et al. ............ 414/225.01 |
| 4,988,252 | A | * | 1/1991 | Yamamoto et al. ....... 414/331.07 |
| 6,238,283 | B1 | * | 5/2001 | Matsuyama et al. ........... 454/187 |
| 6,298,979 | B1 | * | 10/2001 | McNamara ................. 198/774.1 |
| 6,524,057 | B1 | * | 2/2003 | Park .............................. 414/663 |
| 6,547,473 | B2 | * | 4/2003 | Takayama et al. .............. 403/25 |
| 6,678,583 | B2 | * | 1/2004 | Nasr et al. ...................... 700/245 |
| 6,709,225 | B1 | * | 3/2004 | Pitts et al. ...................... 414/787 |
| 6,883,770 | B1 | * | 4/2005 | Miyajima et al. ............. 248/544 |
| 7,044,703 | B2 | * | 5/2006 | Fukuda et al. ........... 414/416.03 |
| 2003/0031538 | A1 | | 2/2003 | Weaver |
| 2003/0113189 | A1 | * | 6/2003 | Kaji et al. ...................... 414/217 |
| 2003/0156928 | A1 | | 8/2003 | Sackett et al. |
| 2006/0045665 | A1 | * | 3/2006 | Hall et al. ...................... 414/217 |

(Continued)

FOREIGN PATENT DOCUMENTS

| JP | 2001-298069 A | 10/2001 |
| JP | 2002-175998 | 6/2002 |

(Continued)

OTHER PUBLICATIONS

Decision of Rejection with machine translation, dated Dec. 27, 2011, Japanese Patent Application No. 2009-142619, Murata Machinery, Ltd.

(Continued)

*Primary Examiner* — Jonathan Snelting
(74) *Attorney, Agent, or Firm* — Roylance, Abrams, Berdo & Goodman, LLP

(57) ABSTRACT

The front automatic storage system includes a plurality of shelves, a transferring apparatus, and a moveable frame. The shelves are arranged facing a semiconductor processing apparatus and at least one of the shelves is positioned above a transfer port of the semiconductor processing apparatus. The transferring apparatus is contrived to move among the shelves and transfer cassettes C between any shelf and the transfer port. The frame is contrived such that it can move the transferring apparatus and the at least one shelf positioned above the transfer port. The frame is also contrived such that it can move in a first horizontal direction toward and away from a first position where the at least one shelf is arranged above the transfer section.

8 Claims, 8 Drawing Sheets

(56) References Cited

U.S. PATENT DOCUMENTS

2007/0059131 A1* 3/2007 Yoshitaka .................... 414/217
2007/0286711 A1* 12/2007 Hashimoto et al. .......... 414/217

FOREIGN PATENT DOCUMENTS

| JP | 2003-292119   | 10/2003 |
| JP | 2004-015029 A | 1/2004  |
| JP | 2004-238089 A | 8/2004  |
| JP | 2005-001886   | 1/2005  |
| JP | 2005-280929   | 10/2005 |
| JP | 2007-096140   | 4/2007  |
| JP | 2009-059775   | 3/2009  |
| JP | 2010-184760   | 8/2010  |

OTHER PUBLICATIONS

European search report, Dated Mar. 30, 2011, Patent Application No. EP 10 16 5297, Murata Machinery, Ltd.
Notification of reason(s) for refusal with machine translation, Dated Mar. 1, 2011, Japanese Patent Application No. 2009-142619, Murata Machinery, Ltd.

* cited by examiner

US 8,974,167 B2

AUTOMATIC STORAGE SYSTEM

CROSS-REFERENCE TO RELATED APPLICATIONS

This application claims priority under 35 U.S.C. §119 to Japanese Patent Application No. 2009-142619 filed on Jun. 15, 2009. The entire disclosure of Japanese Patent Application No. 2009-142619 is hereby incorporated herein by reference.

BACKGROUND OF THE INVENTION

1. Field of the Invention

The present invention relates to an automatic storage system. More particularly, the present invention relates to an automatic storage system for storing articles at a stage between a carrying apparatus and a processing apparatus.

2. Background Information

In a manufacturing plant for semiconductor devices or liquid crystal devices, semiconductor devices or liquid crystal devices are formed on substrates, e.g., silicon wafers or glass plates, using such processes as thin film deposition, oxidation, and etching. Between such processes, substrates are stored in cassettes (which are an example of an "article") and the cassettes are moved by automated guided vehicles. A buffer called a front automatic storage system is provided in a transfer area between a processing apparatus and a carrying apparatus in order to adjust a processing time between the carrying apparatus and the processing apparatus (e.g., see Japanese Laid-open Patent Publication No. 2001-298069).

A conventional front automatic storage system has a plurality of shelves arranged with vertical spaces in-between and configured for storing cassettes and a transferring apparatus contrived to transfer articles between shelves.

The shelves are arranged vertically with spaces in-between, and the uppermost shelf serves as a cassette transfer area where cassettes are transferred to and from an automatic guided vehicle serving as a carrying apparatus. A cassette transfer port through which substrates are transferred to the processing apparatus is arranged below the bottommost shelf. At the transfer port, the processing apparatus extracts substrates from the cassette so that the substrates can be processed by the processing apparatus.

The transferring apparatus is arranged facing an opposite side of the shelves as the processing apparatus and is contrived to transfer cassettes between shelves and between a shelf and the transfer port.

By providing such a front automatic storage system, cassettes can continue being carried in and out and the system can be prevented from going down even when the supply or carrying away of cassettes is interrupted due to troubles with the processing apparatus or the carrying apparatus.

With a front automatic storage system like that described above, the front automatic storage system gets in the way when maintenance is performed on the processing apparatus and the transfer port of the processing apparatus. Thus, during maintenance, the front automatic storage system needs to be removed. With a conventional front automatic storage system, there is a possibility that the time required for removing and reattaching the front automatic storage system will cause the idle time of the processing apparatus to be long.

SUMMARY OF THE INVENTION

One aspect of the present invention is to provide a front automatic storage system that reduces the idle time of a processing apparatus as much as possible during maintenance.

A plurality of modes of the invention that achieve the object will now be explained. Any combination of these modes can be used as necessary.

An automatic storage system according to one aspect of the present invention is one for use with a processing apparatus having at least a transfer port of a processing apparatus. The automatic storage system comprises a plurality of shelves, a transferring apparatus, and a mover. The plurality of shelves faces the processing apparatus and at least one of the shelves is movably provided above the transfer port of the processing apparatus. The transferring apparatus transfers an article between the shelves and the transfer port. The mover moves the transferring apparatus and the at least one of the shelves above the transfer port. The mover is movable in a first horizontal direction toward and away from a first position where the at least one of the shelves are provided above the transfer port.

With this automatic storage system, articles are supplied to the plurality of shelves and a transferring apparatus serves to transfer articles between a shelf and the transfer port. During maintenance of the processing apparatus, the mover is moved away from the first position in the first horizontal direction. Thus, the shelf arranged above the transfer port and the transferring apparatus are moved together with the mover. When the maintenance is finished, the mover is returned to the first position by moving it in the first horizontal direction toward the first position.

In this way, the shelf above the transfer port and the transferring apparatus can be moved away for maintenance by simply moving them from the first position. When the maintenance is finished, the shelf and the transferring apparatus can be put back into use by returning the mover to the first position. As a result, the time required for moving away and returning the shelf and the transferring apparatus can be shortened. Thus, an automatic storage system can be obtained which enables the idle time of a processing apparatus to be shortened as much as possible during maintenance.

It is preferable that the mover has a plurality of wheels.

It is preferable that the mover can move the transferring apparatus and all of the shelves together.

In such a case, maintenance is even easier to perform because the entire automatic storage system can be moved away.

It is preferable that the automatic storage system further comprises a stopper configured to stop and release the mover at a second position located apart from the first position.

With such a stopper, a movement range for the mover is established between the first position and the second position. Thus, by setting the second position to be a position where disconnecting electrical wiring is not necessary, maintenance can be performed by merely moving the mover to the second position. As a result, putting back the mover into use is even easier and the processing apparatus can start operating quickly after maintenance is finished.

It is preferable that the automatic storage system further comprises a guide mechanism that can guide the mover along the first horizontal direction. The guide mechanism is provided in an area including the first position and excluding the second position.

In such a case, the mover can be more easily returned in the first position because it is guided by the guide mechanism in a region including the first position.

It is preferable that the automatic storage system further comprises a toppling-over prevention mechanism prevents the mover from toppling over by connecting the mover to a floor surface on which the mover moves.

In such a case, the work of moving away and returning the mover can be accomplished more easily and efficiently because the mover does not easily topple over during moving away and returning.

It is preferable that a positioning mechanism can position the mover in the first position.

In such a case, the mover is positioned in the first position by the positioning mechanism. Thus, when the mover is returned to the first position after maintenance, the position of the mover does not need to be adjusted and the mover can be arranged in the first position quickly and precisely. Consequently, the processing apparatus can start operating quickly after maintenance is finished.

It is preferable that the automatic storage system further comprises a toppling-over prevention mechanism that can prevent the mover from toppling over by connecting the mover to a floor surface on which the mover moves. The toppling-over prevention mechanism prevents the mover from toppling over at a place apart from a position where the mover is guided by the guide mechanism.

It is preferable that the stopper has a link mechanism employing a Scott Russell Link including a first link having a first end portion connected to a floor surface on which the mover moves and a second end portion slidably and vertically guided along the mover, and a second link having a first end portion connected to a middle portion of the first link and a second end portion connected to a lower portion of the mover. The stopper prevents the mover from toppling over by connecting the mover to the floor surface.

It is preferable that the guide mechanism includes a guide roller fixed to the fixed plate and a guide rail that can be guided by the guide roller. The guide rail includes a first rail member disposed on the lowest portion of the mover and a second rail member arranged on a side of the first rail member towards the second position. The positioning mechanism and the second rail member position the mover in the first position.

With the present invention, the shelf above the transfer port and the transferring apparatus can be moved away for maintenance by simply moving them from the first position. When the maintenance is finished, the shelf and the transferring apparatus can be put back into use by returning the mover to the first position. As a result, the time required for moving away and returning the shelf and the transferring apparatus can be shortened. Thus, a front automatic storage system can be obtained which reduces the idle time of a processing apparatus as much as possible during maintenance.

These and other objects, features, aspects and advantages of the present invention will become apparent to those skilled in the art from the following detailed description, which, taken in conjunction with the annexed drawings, discloses a preferred embodiment of the present invention.

DETAILED DESCRIPTION OF THE EMBODIMENTS

Figure 1:
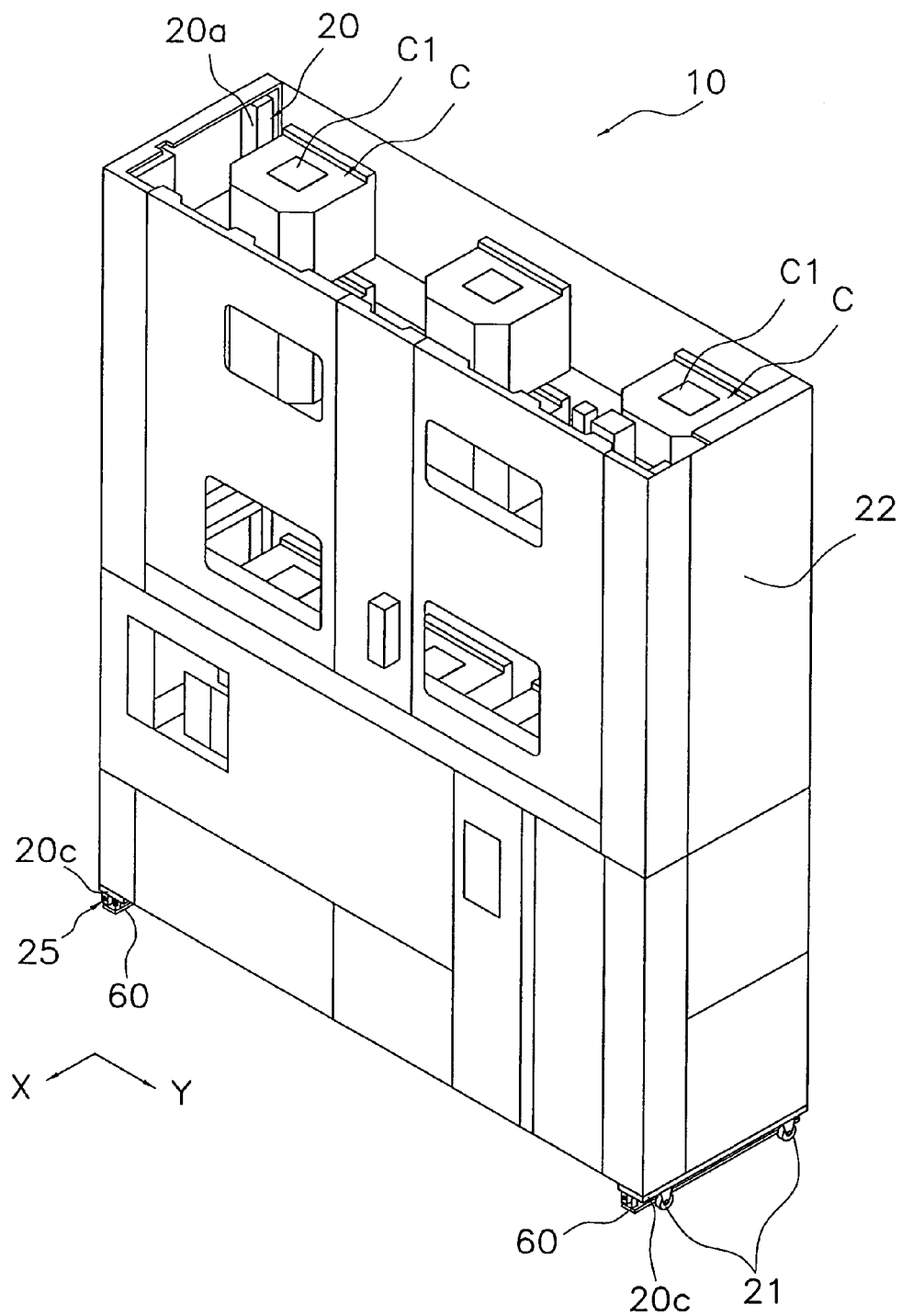
FIG. 1 is a front perspective view of a front automatic storage system according to an embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

(1) General Overview of the Automatic Storage System

FIGS. 1 to 4 show a front automatic storage system 10 according to an embodiment of the present invention. The front automatic storage system 10 is arranged, for example, between an automatic guide vehicle (not shown) contrived to travel along a ceiling and a semiconductor processing apparatus 12 (FIG. 4) exemplifying a processing apparatus. The front automatic storage system 10 is arranged to overlap with a transfer port 14 provided on an outer perimeter of the semiconductor processing apparatus 12. The transfer port 14 has, for example, four cassette loading platforms 14a.

The front automatic storage system 10 is configured to store cassettes (example of an article) C that have been delivered by an automatic guided vehicle (not shown). Each of the cassettes C contains a plurality of unprocessed substrates to be processed by the semiconductor processing apparatus 12. The automatic guided vehicle is contrived to transfer a cassette C by moving an elevator up and down. More specifically, the automatic guided vehicle stops above the front automatic storage system 10, lowers the elevator, and transfers a cassette C to and from two shelves 24 (explained later) or to and from the transfer port 14.

The front automatic storage system 10 may also store cassettes C containing substrates that have already been processed by the semiconductor processing apparatus 12 and are to be carried away by the automatic guided vehicle. The front automatic storage system 10 comprises a frame 20, an outer wall panel 22 arranged to surround an outside surface of the frame 20, shelves 24 for holding cassettes C, and a transferring apparatus 26.

The frame 20 is an example of a mover. The frame 20 is contrived such that it can be moved together with shelves 24 toward the transfer port 14 and away from the transfer port 14 from a first position along an X direction exemplifying a first horizontal direction. The frame 20 is also contrived such that it can be fixed in the first position. The first position is a position shown in FIGS. 1 and 3 where one of the shelves 24 is arranged above the transfer port 14. A position above or below the transfer port 14 is a position where the shelf 24 overlaps with the transfer port 14 in a plan view.

The transferring apparatus 26 serves to transfer cassettes C between the shelves 24 and the cassette loading platforms 14a.

The front automatic storage system 10 further comprises a positioning mechanism 25, a guide mechanism 27, a stopper mechanism 29, and a toppling-over prevention mechanism 31. The positioning mechanism 25 serves to position the frame 20 in the first position. The guide mechanism 27 serves to guide the frame 20 in the X direction. The stopper mechanism 29 is contrived such that it can stop the frame 20 at a second position, shown in FIG. 2, which is located apart from the first position, and such that it can release the frame 20 from the stopped condition. The toppling prevention mechanism 31 serves to prevent the frame 20 from toppling over.

(2) Constituent Features of the Frame and the Outer Wall Panel

Figure 2:
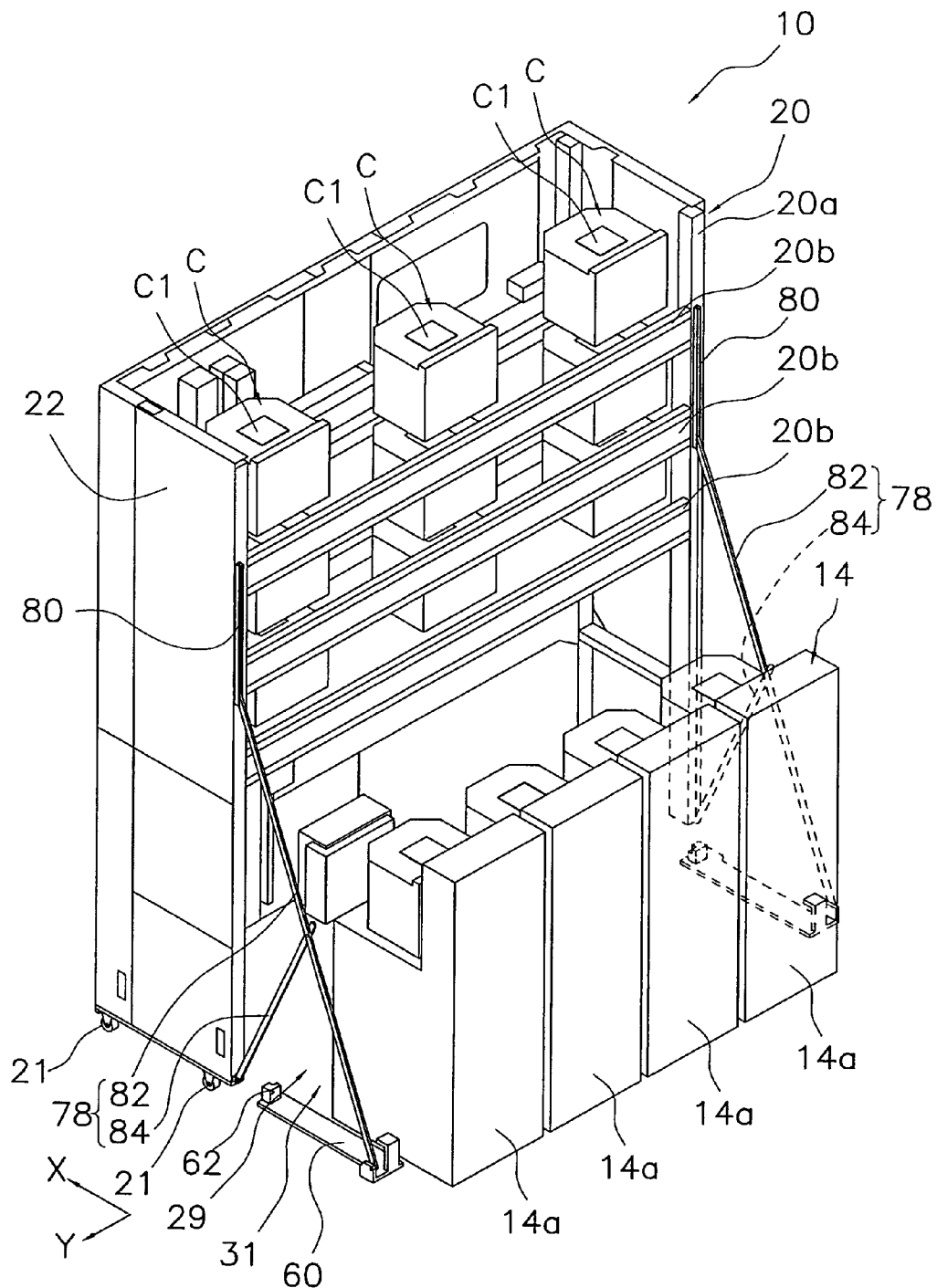
FIG. 2 is a rear perspective view of the front automatic storage system after it has been moved to a second position.
Figure 3:
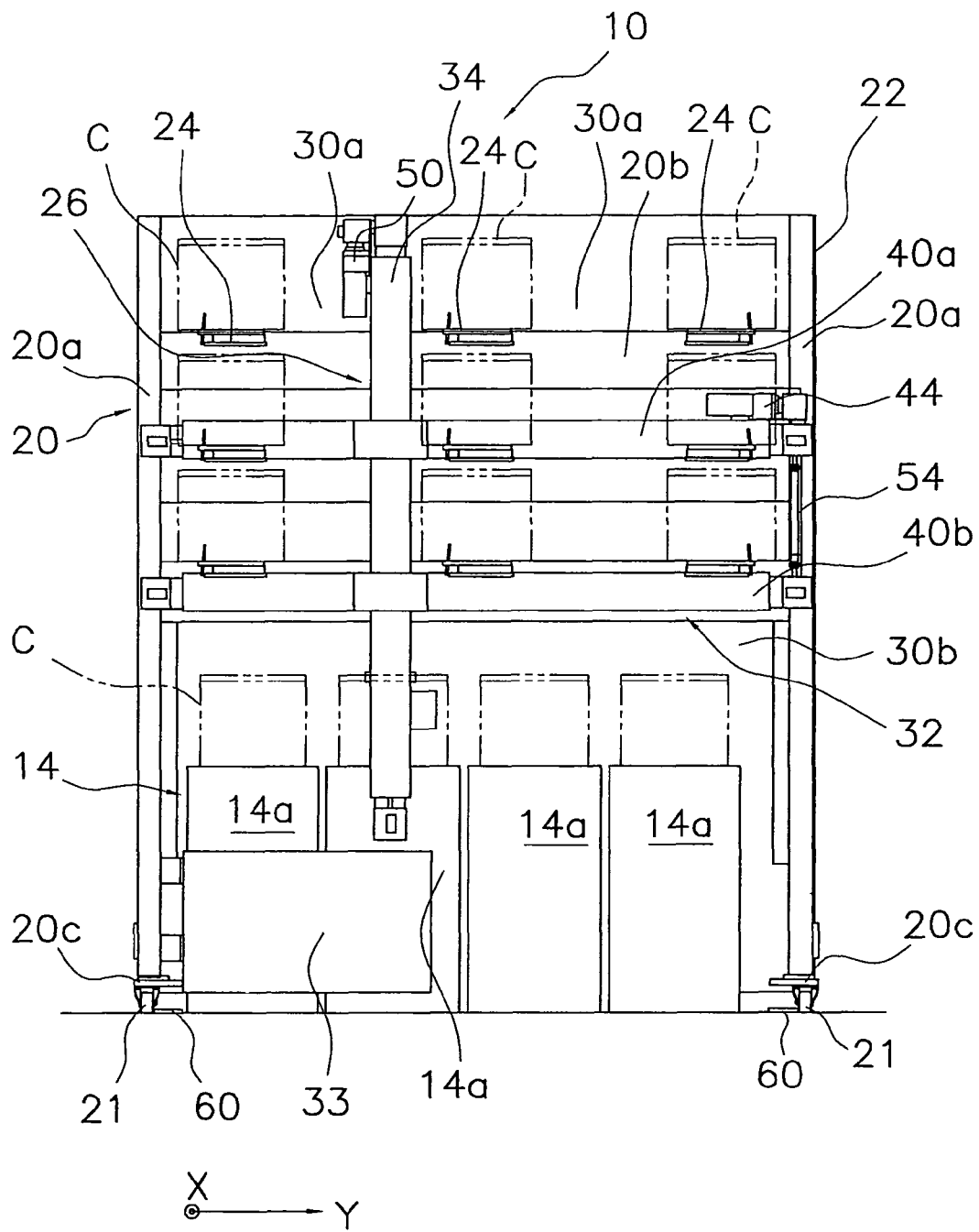
FIG. 3 is a frontal view of the same with an outer wall panel removed.

As shown in FIGS. 2 and 3, the frame 20 has four vertical support members 20a arranged at four corners, connecting members 20b that connect the vertical support members 20a in front-to-rear and left-to-right directions, and two bottom plate members 20c arranged at lower ends of the vertical support members 20a. The connecting members 20b connecting in a left-to-right direction are arranged chiefly on a back side, i.e., on a side closer to the semiconductor processing apparatus 12, and not on a front side. Each of the two bottom plate members 20c is arranged to be oriented along the X direction and to connect the lower ends of the two vertical support members 20a arranged on one or the other of two ends of the frame 20 that are opposite each other along a Y direction as a second horizontal direction: Two wheels 21 separated from each other along the X direction are attached to opposite ends of the bottom surface of each of the bottom plate members 20c. As a result, the frame 20 can move in the X direction.

Figure 10:
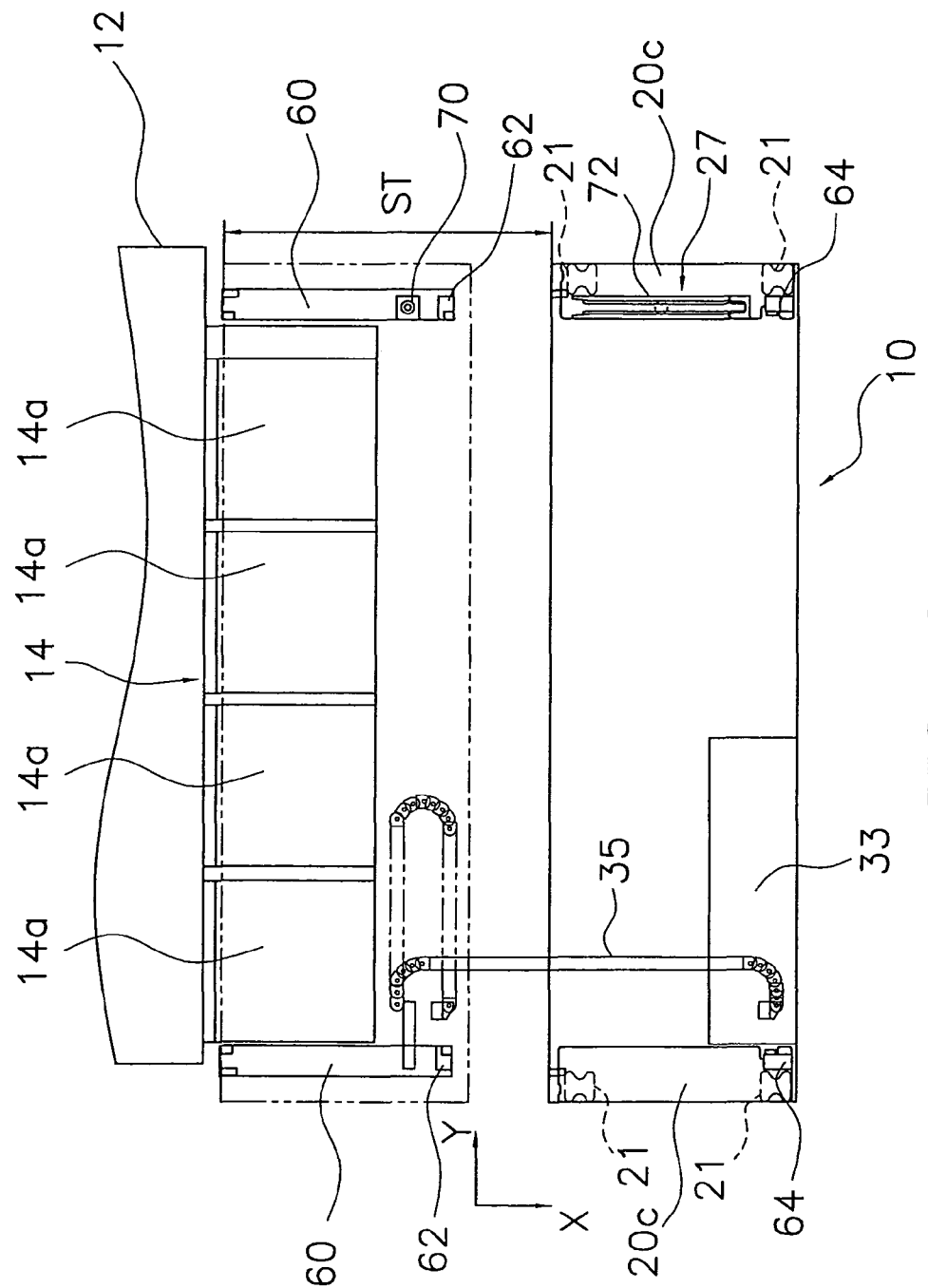
FIG. 10 is a plan view of a front automatic storage system that has been moved to a second position.

As shown in FIG. 10, a control panel 33 is provided on the frame 20. Electrical wiring is routed to pass through the inside of a cableveyor 35 arranged between the control panel 33 and the floor surface. The cableveyor 35 has an allowable movement distance equal to a prescribed stroke ST (explained later). The prescribed stroke ST is, for example, 950 mm. The cableveyor 35 is stored in a compact state in front of the transfer port 14 when the frame 20 is in the first position.

The transfer port 14 of the semiconductor processing apparatus 12 is arranged on a lower portion with respect to the frame 20. The transfer port 14 is configured such that a cassette C can be placed thereon. The semiconductor processing apparatus 12 is contrived to open a cassette C, retrieve a substrate (e.g., a circular substrate) from the cassette C, process the substrate, and place the processed substrate back into the cassette C.

The outer wall panel 22 is configured to cover a front side, a left side, a right side, and an upper portion of a back side of the front automatic storage system 10.

(3) Constituent Features of a Shelf

The shelves 24 are arranged in vertical columns and horizontal rows. In this embodiment, there are three shelves 24 in each column and in each row, making a total of nine shelves 24. Each shelf 24 is configured such that a cassette C can be placed on an upper surface of the shelf 24 and such that the position of the placed cassette C is regulated. The shelves 24 are fixed to the connecting members 20b arranged in the Y direction of the frame 20. Vertical pathways 30a are provided between columns of shelves 24 such that the columns of shelves 24 are spaced apart along the Y direction and the transferring apparatus 26 can pass through vertically between the shelves 24. Thus, in this embodiment, the shelves 24 and vertical pathways 30a are arranged in the order of "shelf 24, vertical pathway 30a, shelf 24, vertical pathway 30a, shelf 24" along the Y direction such that every shelf 24 faces a vertical pathway 30a. As a result, the transferring apparatus 26 can transfer cassettes C among all of the shelves 24 and the transfer port 14. A cassette reader (not shown) contrived to identify a cassette C is provided on each of the shelves 24. The uppermost row of the shelves 24 is used for receiving and transferring cassettes C to and from an automatic guided vehicle. A horizontal pathway 30b exists between the lowermost row of the shelves 24 and the transfer port 14.

(4) Constituent Features of the Transferring Apparatus

The transferring apparatus 26 is a two-axis apparatus having a horizontal axis oriented in a left-to-right direction and a vertical axis and is contrived such that it can hold a cassette C through a movement in a horizontal direction. The transferring apparatus 26 includes a horizontal rail 32, a vertical rail 34 contrived to move along the horizontal rail 32, and a transfer head 36 contrived to move independently along the vertical rail 34. The horizontal rail 32 is arranged along a horizontal direction on a front side of the shelves 24 in a way that a space exists between the horizontal rail 32 and the shelves 24.

Figure 4:
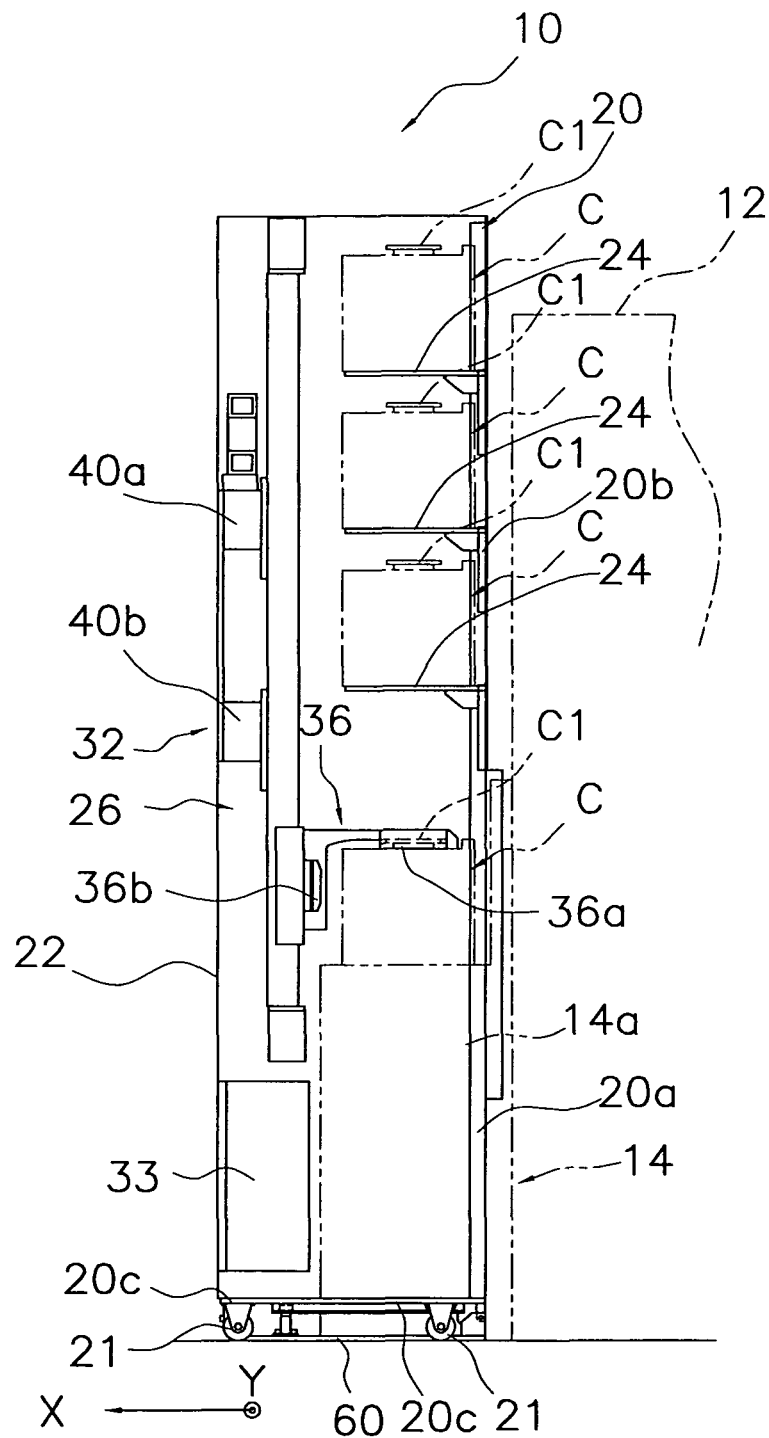
FIG. 4 is a lateral cross sectional view of the same.

As shown in FIG. 3, the horizontal rail 32 is arranged along a left-to-right direction. As shown in FIGS. 3 and 4, the horizontal rail 32 has an upper rail member 40a and a lower rail member 40b. A toothed belt (not shown) is mounted around each of the upper rail member 40a and the lower rail member 40b. The toothed belts are driven by a horizontal drive motor 44 that is fixed to the upper rail member 40a. The torque of the horizontal drive motor 44 is also transferred to the lower rail member 40b through a connecting shaft 54. The upper and lower toothed belts are fixed to the vertical rail 34.

As shown in FIG. 3, the vertical rail 34 is provided with a vertical drive motor 50 for driving the transfer head 36 in a vertical direction. The structure of the vertical rail 34 is generally the same as the structure of the upper rail member 40a of the horizontal rail 32. The transfer head 36 is fixed to a toothed belt (not shown).

As shown in FIG. 4, a pair of holding parts 36a is provided on the transfer head 36. The holding parts 36a are contrived to open and close in a left-to-right direction (direction perpendicular to the plane of the paper in FIG. 4) such that they can hold a protrusion C1 formed on an upper surface of the cassette C. A cassette identifying sensor 36b contrived to recognize a cassette C is provided on the transfer head 36 in such a position that it faces toward a cassette C. The transfer head 36 has a head motor (not shown) that serves to open and close the holding parts 36a. The transfer head 36 opens and closes the holding parts 36a so as to hold and release the protrusion C1 when delivering and receiving to and from a shelf 24. The transfer head 36 is guided by the horizontal rail 32 and the vertical rail 34 such that it can move along the two vertical pathways 30a and the horizontal pathway 30b.

(5) Constituent Features of the Positioning Mechanism

Figure 5:
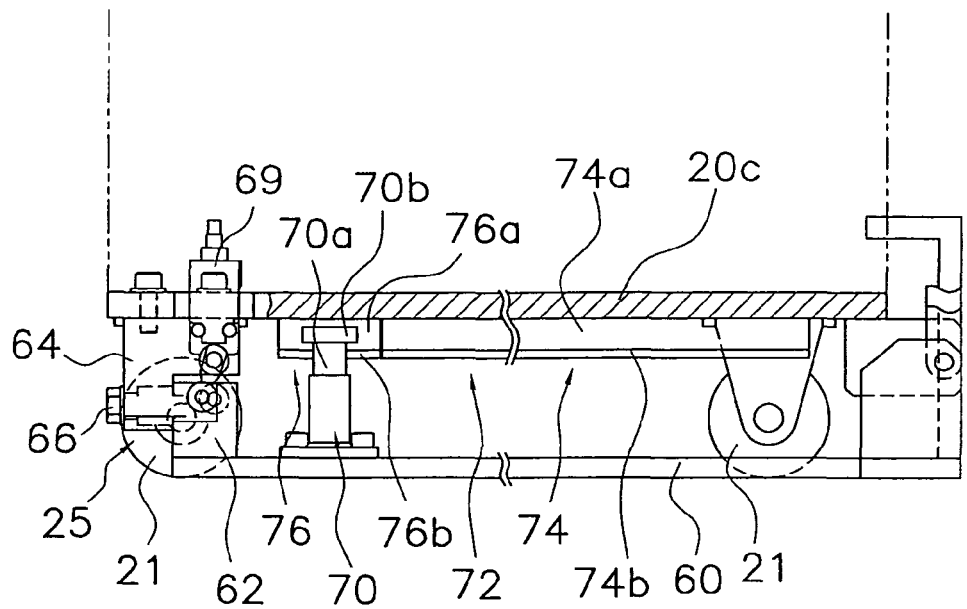
FIG. 5 is an enlarged partial cross sectional view of a lower portion of a frame.
Figure 6:
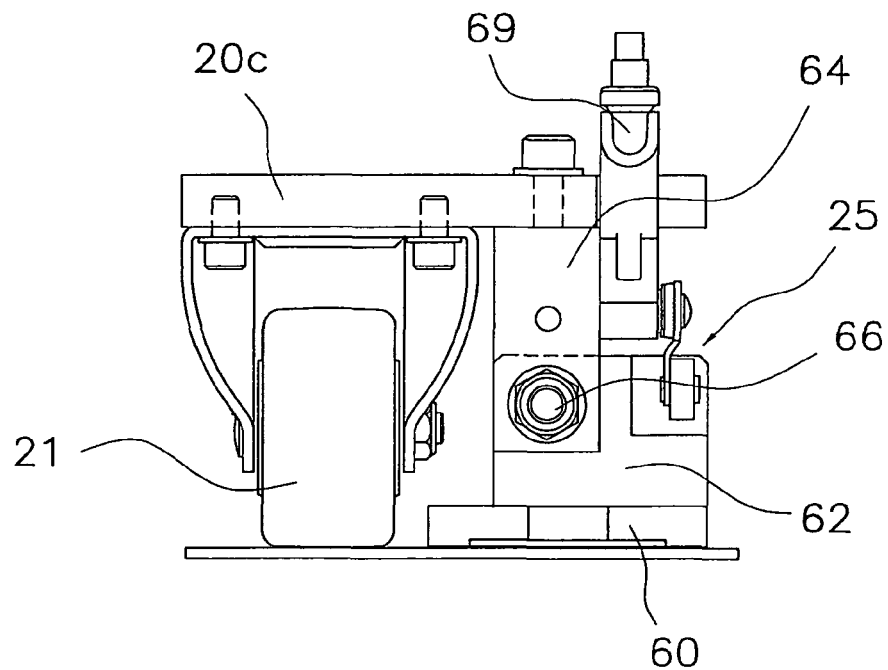
FIG. 6 is an enlarged frontal view of a portion including a positioning mechanism.
Figure 7:
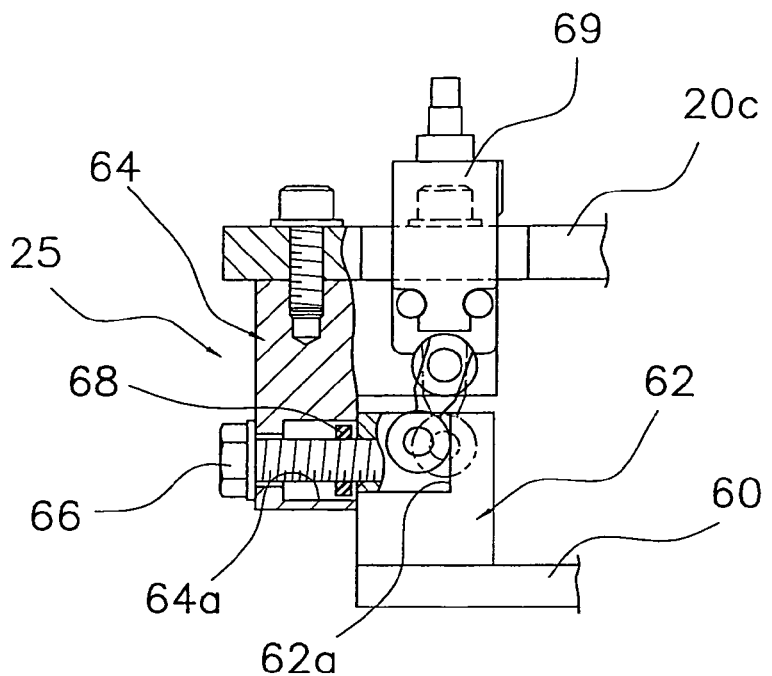
FIG. 7 is an enlarged lateral partial cross sectional view of a portion including the positioning mechanism.

As shown in FIG. 5, the positioning mechanism 25 is arranged between a floor surface and a lower surface of the bottom plate members 20c, which are arranged on the frame 20 and separated from each other along a Y direction. The positioning mechanism 25 comprises two stationary plates 60 that are fixed in the first position on the floor surface under the bottom plate members 20c, first positioning blocks 62 each arranged on an upper surface of a front end portion of a respective stationary plate 60, and second positioning blocks 64 each arranged on a lower surface of a front end portion of a respective bottom plate member 20c. The second positioning block 64 is arranged to touch against a front side of the first positioning block 62. The second positioning block 64 is fixed to the first positioning block 62 with fastening bolts 66 inserted from the front side. As shown in FIG. 7, a circular recess 64a is formed in a portion of the second positioning block 64 where each of the fastening bolts 66 is passed through. The recess 64a is configured to hold, for example, an elastic retaining ring 68 for the fastening bolt 66. As a result, the fastening bolt 66 will not fall from the second positioning block 64 even if it becomes loose and detaches from the first positioning block 62 while the frame 20 is being moved. The frame 20 can be positioned to the first position in the X direction by making the second positioning block 64 touch against the first positioning block 62.

A detecting section 62a is formed in a recessed manner in the first positioning block 62. A limit switch 69 contacts the detecting section 62a and gets turned on when the frame 20 has been returned to the first position. The limit switch 69 is fixed to the bottom plate member 20c. Positioning of the frame 20 in the Y direction is accomplished using a portion of the guide mechanism 27 and will be explained later. Thus, a portion of the constituent features of the guide mechanism 27 forms a part of the positioning mechanism 25.

Figure 8:
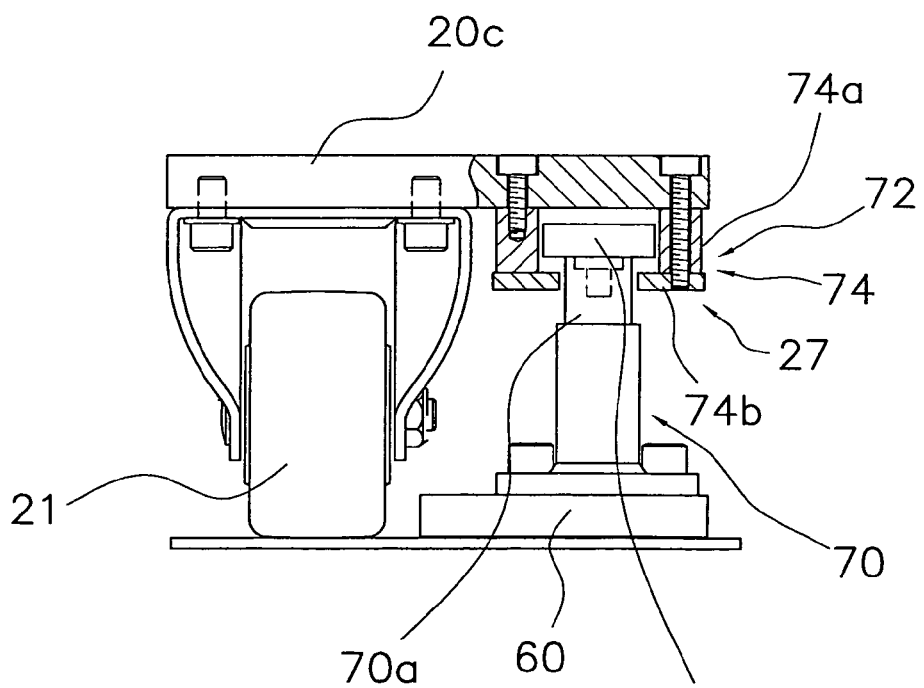
FIG. 8 is an enlarged frontal partial cross sectional view of a portion including a guide mechanism.
Figure 9:
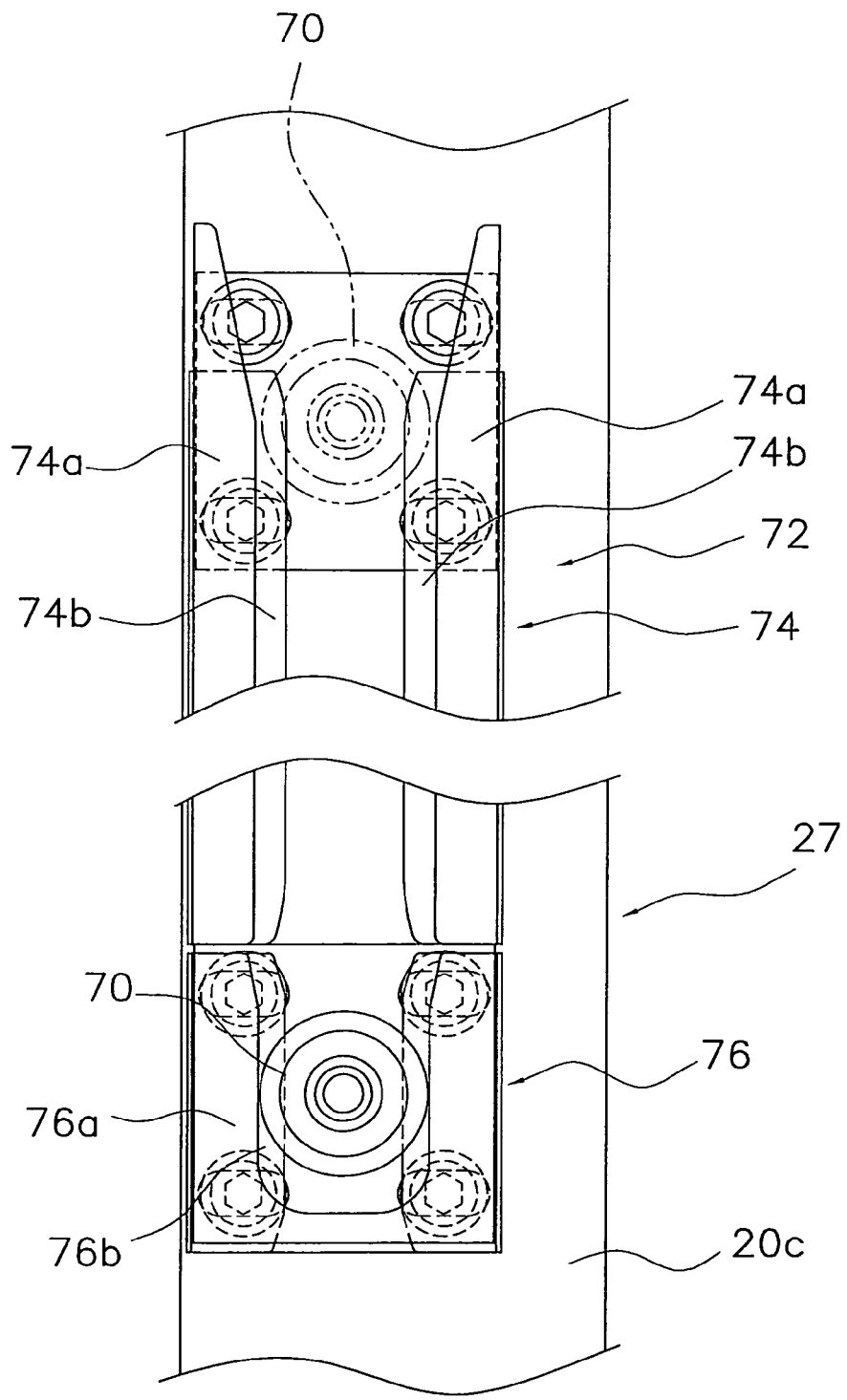
FIG. 9 is a partial plan view of a guide rail of the guide mechanism.

As shown in FIGS. 8 to 10, the guide mechanism 27 is contrived to guide the frame 20 in the X direction within a region that includes the first position. The guide mechanism 27 has a guide roller 70, arranged erectly on one of the stationary plates 60, and a guide rail 72 configured to engage with and guide the guide roller 70. The guide roller 70 is provided on one of the two stationary plates 60. In this embodiment, the guide roller 70 is erectly arranged on an upper surface of the stationary plate 60 depicted on the right side in FIG. 10 so as to be positioned on an inward (rear) side of the first positioning block 62. As shown in FIG. 8, the guide roller 70 includes a guide shaft 70a arranged erectly on the stationary plate 60 and a cam follower 70b that is screwed onto the guide shaft 70a.

The guide rail 72 is oriented along the X direction and arranged on a lower surface of the bottom plate member 20c on which the guide roller 70 is provided. The full length of the guide rail 72 in the X direction is shorter than the prescribed distance ST. As shown in FIG. 9, the guide rail 72 has a first rail member 74 and a second rail member 76 arranged adjacent to the first rail member 74 in an X direction. The first rail member 74 has a pair of first guide parts 74a arranged facing opposite each other with an outer peripheral surface of the cam follower 70b disposed in-between and a pair of first facing parts 74b arranged on a lower surface of the first guide parts 74a so as to face toward a lower surface of the cam follower 70b. As shown in FIG. 8, the first guide parts 74a and the first facing parts 74b are arranged and configured to give the first rail member 74 an L-shaped cross section and to cover the cam follower 70b. The first guide parts 74a serve to guide the frame 20 in the X direction by engaging with the guide roller 70. The first facing parts 74b serve to prevent the frame 20 from toppling over while it is being guided. The first guide parts 74a and the first facing parts 74b are fixed to the bottom plate member 20c with bolts. The first guide parts 74a are arranged to have a gap of, for example, approximately 1 mm with respect to the outer peripheral surface of the cam follower 70b. An entrance opening (upper side of FIG. 9) of the first guide parts 74a is configured to widen toward the front side such that the gap gradually narrows when the frame 20 is being returned to the first position from the second position.

The second rail member 76 is provided for positioning the frame 20 in the Y direction. Consequently, the second rail member 76 functions both as a part of the guide mechanism 27 and as a part of the positioning mechanism 25. As shown in FIG. 9, the second rail member 76 is a substantially square shaped member having a second guide part 76a and a second facing part 76b. The second guide part 76a is arranged to have a gap of, for example, approximately 0.3 mm with respect to the outer peripheral surface of the cam follower 70b. Thus, the second guide part 76a serves to position the frame 20 in the Y direction. The second guide part 76a and the second facing part 76b have basically the same function as the first guide parts 74a and the first facing parts 74b and are fastened to the lower surface of the bottom plate member 20c with bolts. The second guide part 76a is open at one end and closed at the other end. A small gap is provided at a portion where the first rail member 74 and the second rail member 76 connect together. At the connecting portion, the second guide part 76a is slightly tapered toward a tip end.

(6) Constituent Features of the Stopper Mechanism

The stopper mechanism 29 also functions to prevent the frame 20 from toppling over at a position where the frame 20 is separated from the guide mechanism 27. As shown in FIG. 2, the stopper mechanism 29 comprises a pair of left and right link mechanisms 78 forming the so-called Scott Russell linkages. Each of the link mechanisms 78 has a first link 82 and a second link 84 having one end connected to a middle portion of the first link 82. One end of the first link 82 is rotatably connected to a back-side end portion of the corresponding stationary plate 60 and the other end of the first link 82 is arranged to be vertically guided by a vertical slide rail 80 arranged on a back side of the frame 20. The other end of the second link 84 is turnably connected to a back-side end portion of the bottom plate member 20c. With the link mechanisms 78 configured as described, the frame 20 moves in a substantially parallel manner. The slide rail 80 is configured to restrict downward movement of said other end of the first link 82 at a middle position of the slide rail 80. As a result, the movement range of the frame 20 is restricted. In this embodiment, a prescribed stroke ST between the first position and the second position of the frame 20 is set to a minimum distance required for maintenance, e.g., 950 mm. Thus, when the frame 20 is pushed from the back side while in the first position, it moves 950 mm before stopping at the second position. When the frame 20 is pushed from the front side while in the second position, the stopped state is released and the frame 20 moves toward the first position.

The stopper mechanism 29 also functions as a toppling prevention mechanism 31 serving to prevent the frame 20 from toppling over while the frame 20 is moving within the interval where it is not guided by the guide mechanism 27. In order to move the frame 20 beyond the range in which it is restricted by the stopper mechanism 29, the cableveyor 35, the wiring, and the link mechanisms 78 are disconnected so that the restricted state of the stopper mechanism 29 is released.

(7) Operation and Movement of the Front Automatic Storage System

Consider a situation in which an automatic guided vehicle (not shown) delivers a cassette C to an uppermost shelf 24 of a front automatic storage system 10 configured as described heretofore. The transferring apparatus 26 picks up the delivered cassette C from the vertical pathway 30a facing the uppermost shelf 24 holding the cassette C and transfers the cassette C to a shelf 24 in one of the two lower rows of shelves 24. Later, the transferring apparatus 26 transfers the cassette C to the transfer port 14 in response to a request from the semiconductor processing apparatus 12.

In order to retrieve a cassette C to be transferred, the transfer head 36 moves to a position above a center of the cassette C with the holding parts 36a in an open state. More specifically, the transfer head 36 moves to a vertical pathway 30a adjacent to the cassette C and moves upward along the vertical rail 34. When it reaches a position higher than the cassette C, the transfer head 36 moves horizontally along the horizontal rail 32 to a position above the center of the cassette C. Then, the transfer head 36 descends toward the cassette C and closes the holding parts 36a using the head motor so as to hold the protrusion C1. Once the protrusion C1 has been held in this manner, the cassette C can be transferred. The transfer head 36 then transfers the cassette C from the uppermost shelf 24 to a shelf 24 in one of the two lower rows. In some cases, depending on a transfer command, the transfer head 36 may transfer the cassette C from the uppermost shelf 24 directly to the cassette loading platform 14a of the transfer port 14.

When the frame 20 is to be moved away from the first position in order to perform maintenance on the semiconductor processing apparatus 12 or the front automatic storage system 10, the fastening bolts 66 arranged below the front side of the front automatic storage system 10 are loosened and the second positioning block 64 is moved away from the first positioning block 62. The fastening bolts 66 will not fall out of place after being loosened because they are held by the retaining rings 68.

After the bolts 66 are loosened, the frame 20 is moved from the first position toward the second position by pushing against the back side of the frame 20 by hand. When this is done, the aforementioned other end of the first links 82 of the link mechanisms 78 descend gradually along the slide rail 80 on the back side of the frame 20. The guide roller 70 is guided along the guide rail 72 such that the frame 20 moves in the X direction without experiencing a large amount of mechanical slop. When the frame 20 reaches the second position, the first links 82 of the link mechanisms 78 are restricted at the lower end of the slide rail 80 and cannot descend any farther. As a result, the frame 20 is stopped from moving in the X direction. In this situation, it is not necessary to disconnect the wiring because the wiring is guided by the cableveyor 35.

There are times when a cassette C containing substrates requiring processing is delivered by an automatic guided vehicle or a cassette C containing processed substrates is delivered to the transfer port 14 during maintenance of the front automatic storage system 10. In such a situation, the cassette C is transferred directly between the transfer port 14 and the automatic guided vehicle. Since the cassette can be transferred directly between the transfer port 14 and the automatic guided vehicle, it is not necessary to stop the operation of the semiconductor processing apparatus 12 during maintenance of the front automatic storage system 10.

When maintenance of the semiconductor processing apparatus 12 is finished, the front side of the frame 20 is pushed by hand to move the frame 20 toward the first position. The link mechanism 78 prevents the frame 20 from toppling over until the guide roller 70 engages with the guide rail 72. The pair of link mechanisms 78 allow the frame 20 to move in a parallel fashion. After the guide roller 70 engages with the guide rail 72, the frame 20 is guided in the X direction by the guide roller 70. The frame 20 is also prevented from toppling over by the guide roller 70. When the two first positioning blocks 62 contact the two second positioning blocks 64, respectively, positioning of the frame 20 in the X direction is complete. At the same time, the frame 20 is positioned in the Y direction when the guide roller 70 engages with the second rail member 76 of the guide rail 72. After the frame 20 is positioned in the first position, the two fastening bolts 66 are tightened such that the second positioning blocks 64 are fastened to the first positioning blocks 62, thus completing the attachment work. The limit switch 69 turns on and informs the semiconductor processing apparatus 12 that the attachment work is finished.

(8) Distinctive Features (A) The automatic storage system 10 is used with a processing apparatus 12 having at least a transfer port 14. The automatic storage system 10 is equipped with a plurality of shelves 24, a transferring apparatus 26, and a frame 20. The plurality of shelves 24 face the processing apparatus 12 and at least one of the shelves 24 is movably provided above the transfer port 14 of the processing apparatus 12. The transferring apparatus 26 transfers a cassette C between the shelves 24 and the transfer port 14. The frame 20 moves the transferring apparatus 26 and the at least one of the shelves 24 above the transfer port 14. The frame 20 is movable in a first horizontal direction toward and away from a first position where the at least one of the shelves 24 are provided above the transfer port 14.

With this front automatic storage system 10, cassettes C are supplied to the plurality of shelves 24 and the transferring apparatus 26 serves to transfer cassettes C between a shelf 24 and the transfer port 14. During maintenance of the semiconductor processing apparatus 12, the frame 20 is moved away from the first position. The shelf 24 provided above the transfer port 14 and the transferring apparatus 26 move together with the frame 20. When the maintenance is finished, the frame 20 is returned to the first position by moving it toward the first position.

With this front automatic storage system 10, the shelf 24 above the transfer port 14 and the transferring apparatus 26 can be moved away for maintenance by simply moving the frame 20 away from the first position. When the maintenance is finished, the shelf 24 above the transfer port 14 and the transferring apparatus 26 can be put back into use by returning the frame 20 to the first position. As a result, the time required for moving away and returning at least one shelf 24 and the transferring apparatus 26 can be shortened. Thus, the front automatic storage system 10 reduces the idle time of the semiconductor processing apparatus 12 as much as possible during maintenance.

(B) The frame 20 has a plurality of wheels 21. Also, the frame 20 is contrived such that the transferring apparatus 26 and all of the shelves 24 can be moved together. Consequently, maintenance is easier to perform because the entire front automatic storage system 10 can be moved away as a whole.

(C) The automatic storage system 10 is further equipped with a stopper mechanism 29 that can stop and release the frame 20 at a second position located apart from the first position. Thus, a movement range for the frame 20 is established between the first position and the second position. By setting the second position to be a position where disconnecting the electrical wiring is not necessary, maintenance can be performed by merely moving the frame 20 to the second position. As a result, putting back the frame 20 into use is even easier and the semiconductor processing apparatus 12 can start operating quickly after maintenance is finished.

(D) The automatic storage system 10 further comprises a guide mechanism 27 that can guide the frame 20 along the first horizontal direction. The guide mechanism 27 is provided in an area including the first position and excluding the second position. As a result, the frame 20 can be more easily returned in the first position because it is guided by the guide mechanism 27 in a region that includes the first position.

(E) The automatic storage system 10 is further equipped with a toppling prevention mechanism 31 that can prevent the frame 20 from toppling over by connecting the frame 20 to a floor surface on which the frame 20 moves. In such a case, the work of moving away and returning the frame 20 from and to the first position can be accomplished more easily and efficiently because the frame 20 does not easily topple over during moving away and returning.

(F) The automatic storage system 10 is further equipped with a positioning mechanism 25 that can position the frame 20 in the first position. Since the frame 20 is positioned in the first position, when the frame 20 is returned to the first position after maintenance, the position of the frame 20 does not need to be adjusted and the frame 20 can be arranged in the first position quickly and precisely. Consequently, the processing apparatus 12 can start operating quickly after maintenance is finished.

(9) Other Embodiments (a) In the previously described embodiment, a front portion of the shelves 24 and the transferring apparatus 26 are fixed to a frame and all of the shelves 24 are moved together. However, the invention is not limited to such a configuration. For example, it is acceptable to separate the frame into a stationary frame and a moveable frame and to fix the shelves that are not arranged above the transfer port to the stationary frame. In such a case, it is not necessary to move the entire automatic storage system in order to perform maintenance and, thus, the task of moving the frame for maintenance is easier.

(b) Although in the previously described embodiment the guide mechanism is provided only on a left side or a right side, it is acceptable to provide guide mechanisms on both the left and right sides. By guiding the frame on both the left and right sides, the frame can be positioned in both the X and Y directions only by the guide mechanisms.

(c) Although in the previously described embodiment the guide mechanism comprises a guide roller and a guide rail, the present invention is not limited to such a mechanism. For example, it is acceptable to use a telescopic rail or a pantograph to form the guide mechanism and the stopper mechanism.

(d) Although in the previously described embodiment the frame 20 employs wheels to make it moveable, it is acceptable to employ a spherical bearing or a low friction member to make the frame moveable.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An automatic storage system, comprising:
a transfer port to and from which an article is transferred;
a plurality of shelves;
a transferring apparatus configured to transfer an article between the shelves and the transfer port;
a mover configured to move the transferring apparatus and at least one of the shelves toward and away from the transfer port, the mover being movable in a first horizontal direction toward a first position where the at least one of the shelves are proximal to the transfer port and the transferring apparatus can transfer an article between the shelves and the transfer port, and the mover being movable in a second and opposite horizontal direction to a second position in which the shelves are positioned away from the transfer port such that the article cannot be moved from and to the transfer port, wherein the first horizontal direction and the second and opposite horizontal direction are parallel to each other and are perpendicular to a traveling direction of an automatic guide vehicle that can provide articles to at least one of the shelves;
a stopper configured to stop and release the mover at a position located apart from the first position;
a guide mechanism configured to guide the mover along the first horizontal direction, the guide mechanism being provided in an area including the first position and excluding the second position; and
a positioning mechanism including a fixed plate fixed in the first position on a floor surface on which the mover moves, a first block provided on the fixed plate, and a second block that comes into contact with the first block from a side towards the second position;
wherein
the guide mechanism includes a guide roller erectly fixed to the fixed plate and a guide rail configured to be guided by the guide roller,
the guide rail includes a first rail member disposed on a lowest portion of the mover and a second rail member arranged on a side of the first rail member towards the second position, and
the positioning mechanism and the second rail member position the mover in the first position.

2. The automatic storage system according to claim 1, wherein the mover has a plurality of wheels together.

3. The automatic storage system according to claim 2, wherein the mover can move the transferring apparatus and all of the shelves.

4. The automatic storage system according to claim 1, wherein the mover can move the transferring apparatus and all of the shelves together.

5. The automatic storage system according to claim 1, further comprising a toppling-over prevention mechanism configured to prevent the mover from toppling over by connecting the mover to a floor surface on which the mover moves.

6. The automatic storage system according to claim 1, further comprising a positioning mechanism configured to position the mover in the first position.

7. The automatic storage system according to claim 1, further comprising a toppling-over prevention mechanism configured to prevent the mover from toppling over by connecting the mover to a floor surface on which the mover moves, wherein the toppling-over prevention mechanism prevents the mover from toppling over at a place apart in the first horizontal direction from a position where the mover is guided by the guide mechanism.

8. The automatic storage system according to claim 1, wherein the stopper has a link mechanism employing a Scott Russell Link including a first link having a first end portion connected to a floor surface on which the mover moves and a second end portion slidably and vertically guided along the mover, and a second link having a first end portion connected to a middle portion of the first link and a second end portion connected to a lower portion of the mover, and the stopper prevents the mover from toppling over by connecting the mover to the floor surface.

* * * * *